(12) United States Patent
Van de Ven

(10) Patent No.: US 8,716,952 B2
(45) Date of Patent: May 6, 2014

(54) LIGHTING DEVICE HAVING FIRST, SECOND AND THIRD GROUPS OF SOLID STATE LIGHT EMITTERS, AND LIGHTING ARRANGEMENT

(75) Inventor: Antony Paul Van de Ven, Sai Kung (CN)

(73) Assignee: Cree, Inc., Durham, NC (US)

( * ) Notice: Subject to any disclaimer, the term of this patent is extended or adjusted under 35 U.S.C. 154(b) by 981 days.

(21) Appl. No.: 12/535,319

(22) Filed: Aug. 4, 2009

(65) Prior Publication Data

US 2011/0031894 A1     Feb. 10, 2011

(51) Int. Cl.
  *H05B 37/02*     (2006.01)
  *F21V 9/00*      (2006.01)

(52) U.S. Cl.
  USPC ........ 315/294; 315/185 R; 315/291; 315/297; 313/498; 313/501; 313/502; 313/503; 362/231; 362/545; 362/612; 362/800

(58) Field of Classification Search
  USPC .............. 315/185 R, 291, 294, 297; 313/498, 313/501–503; 362/231, 545, 612, 800
  See application file for complete search history.

(56) References Cited

U.S. PATENT DOCUMENTS

| | | | |
|---|---|---|---|
| 4,918,487 A | 4/1990 | Coulter, Jr. | |
| 5,631,190 A | 5/1997 | Negley | |
| 5,803,579 A | 9/1998 | Turnbull et al. | |
| 5,851,063 A * | 12/1998 | Doughty et al. | ............. 362/231 |
| 5,912,477 A | 6/1999 | Negley | |
| 6,132,072 A | 10/2000 | Turnbull et al. | |
| 6,563,139 B2 | 5/2003 | Hen | |
| 7,005,679 B2 | 2/2006 | Tarsa et al. | |
| 7,135,664 B2 * | 11/2006 | Vornsand et al. | ............. 250/205 |
| 7,144,130 B2 | 12/2006 | Toyota et al. | |
| 7,213,940 B1 * | 5/2007 | Van De Ven et al. | ......... 362/231 |
| 7,334,917 B2 | 2/2008 | Laski | |
| 7,358,954 B2 | 4/2008 | Negley et al. | |
| 7,564,180 B2 | 7/2009 | Brandes | |

(Continued)

FOREIGN PATENT DOCUMENTS

| | | |
|---|---|---|
| EP | 0 838 866 | 4/1998 |
| WO | 2008/137983 A1 | 11/2008 |

OTHER PUBLICATIONS

U.S. Appl. No. 12/643,670, filed Dec. 21, 2009.
U.S. Appl. No. 61/108,130, filed Oct. 24, 2008, Van de Ven.

(Continued)

*Primary Examiner* — Douglas W Owens
*Assistant Examiner* — Thai Pham
(74) *Attorney, Agent, or Firm* — Burr & Brown, PLLC

(57) ABSTRACT

A lighting device comprising first, second and third groups of solid state light emitters, the first group emitting light having a dominant wavelength of 430 to 490 nm, the second group at 525 to 575 (in some devices 540 to 575 nm), the third group at 610 to 640 nm. In some devices, wavelength of light from emitters in first and second groups, and light from second and third groups, differs by at least 70 nm. Some devices emit light having CRI Ra of at least 70 when first, second and third groups of emitters are illuminated. Also, a lighting arrangement comprising first, second and third groups as above, in addition to a fourth emitter emitting light of dominant wavelength outside the ranges for the first, second and third groups, and not more than 10 nm different from a dominant wavelength of a color on an item to be illuminated.

27 Claims, 3 Drawing Sheets

(56) References Cited

U.S. PATENT DOCUMENTS

| | | |
|---|---|---|
| 7,759,854 B2 | 7/2010 | Miller et al. |
| 2006/0105482 A1 | 5/2006 | Alferink et al. |
| 2007/0137074 A1 | 6/2007 | Van de Ven et al. |
| 2007/0139923 A1 | 6/2007 | Negley |
| 2007/0170447 A1 | 7/2007 | Negley |
| 2007/0171145 A1 | 7/2007 | Coleman |
| 2007/0223219 A1 | 9/2007 | Medendorp, Jr. |
| 2007/0236911 A1 | 10/2007 | Negley |
| 2007/0263393 A1 | 11/2007 | Van de Ven |
| 2007/0274063 A1 | 11/2007 | Negley |
| 2007/0274080 A1 | 11/2007 | Negley |
| 2007/0278934 A1 | 12/2007 | Van de Ven |
| 2007/0278974 A1 | 12/2007 | Van de Ven |
| 2007/0279440 A1 * | 12/2007 | Negley .......................... 345/691 |
| 2007/0279903 A1 | 12/2007 | Negley |
| 2007/0280624 A1 | 12/2007 | Negley |
| 2008/0084685 A1 | 4/2008 | Van de Ven |
| 2008/0084700 A1 | 4/2008 | Van de Ven |
| 2008/0084701 A1 | 4/2008 | Van de Ven |
| 2008/0088248 A1 | 4/2008 | Myers |
| 2008/0089053 A1 | 4/2008 | Negley |
| 2008/0106895 A1 | 5/2008 | Van de Ven |
| 2008/0106907 A1 | 5/2008 | Trott et al. |
| 2008/0112168 A1 | 5/2008 | Pickard |
| 2008/0112170 A1 | 5/2008 | Trott |
| 2008/0112183 A1 | 5/2008 | Negley |
| 2008/0130298 A1 | 6/2008 | Negley |
| 2008/0137347 A1 | 6/2008 | Trott |
| 2008/0259598 A1 | 10/2008 | Sumitani et al. |
| 2008/0278950 A1 | 11/2008 | Pickard |
| 2008/0278952 A1 | 11/2008 | Trott |
| 2008/0278957 A1 | 11/2008 | Pickard |
| 2008/0304261 A1 | 12/2008 | Van de Ven |
| 2008/0304269 A1 | 12/2008 | Pickard |
| 2008/0309255 A1 * | 12/2008 | Myers et al. .................. 315/297 |
| 2008/0310154 A1 | 12/2008 | Van de Ven et al. |
| 2009/0108269 A1 | 4/2009 | Negley |
| 2009/0160363 A1 | 6/2009 | Negley |
| 2009/0184666 A1 | 7/2009 | Myers |
| 2009/0246895 A1 | 10/2009 | You |
| 2010/0079059 A1 | 4/2010 | Roberts |
| 2010/0102199 A1 | 4/2010 | Negley |
| 2010/0102697 A1 | 4/2010 | Van de Ven |
| 2010/0103678 A1 | 4/2010 | Van de Ven |
| 2010/0165001 A1 | 7/2010 | Savvateev et al. |
| 2010/0259182 A1 * | 10/2010 | Man et al. ..................... 315/250 |

OTHER PUBLICATIONS

U.S. Appl. No. 61/108,133, filed Oct. 24, 2008, Negley.
U.S. Appl. No. 61/108,149, filed Oct. 24, 2008, Van de Ven.
Hoelen et al., *Color tunable LED spot lighting,* SAO/NASA ADS Physics Abstract Service, Proceedings of the SPIE, vol. 6337, Sep. 2006, pp. 1-2.
Narendran et al., *Color Rendering Properties of LED Light Sources,* Society of Photo-Optical Instrumentation Engineers, Solid State Light II: Proceedings of the SPIE, 2002.

\* cited by examiner

LIGHTING DEVICE HAVING FIRST, SECOND AND THIRD GROUPS OF SOLID STATE LIGHT EMITTERS, AND LIGHTING ARRANGEMENT

FIELD OF THE INVENTIVE SUBJECT MATTER

The present inventive subject matter is directed to a lighting device. More particularly, the present inventive subject matter is directed to a lighting device comprising at least three groups of solid state light emitters. The present inventive subject matter is also directed to a lighting arrangement comprising solid state light emitters and at least one item to be illuminated.

BACKGROUND

There is an ongoing effort to develop systems that are more energy-efficient. A large proportion (some estimates are as high as twenty-five percent) of the electricity generated in the United States each year goes to lighting. Accordingly, there is an ongoing need to provide lighting which is more energy-efficient.

Solid state light emitters (e.g., light emitting diodes) are receiving much attention due to their energy efficiency. It is well-known that incandescent light bulbs are very energy-inefficient light sources—about ninety percent of the electricity they consume is released as heat rather than light. Fluorescent light bulbs are more efficient than incandescent light bulbs (by a factor of about 10) but are still less efficient than solid state light emitters, such as light emitting diodes.

In addition, as compared to the normal lifetimes of solid state light emitters, e.g., light emitting diodes, incandescent light bulbs have relatively short lifetimes, i.e., typically about 750-1000 hours. In comparison, light emitting diodes, for example, have typical lifetimes between 50,000 and 70,000 hours. Fluorescent bulbs have longer lifetimes (e.g., 10,000-20,000 hours) than incandescent lights, but provide less favorable color reproduction. The impact of the need to replace light emitters is particularly pronounced where access is difficult (e.g., vaulted ceilings, bridges, high buildings, traffic tunnels) and/or where change-out costs are extremely high.

Color reproduction is typically measured using the Color Rendering Index (CRI Ra). CRI Ra is a modified average of the relative measurements of how the color rendition of an illumination system compares to that of a reference radiator when illuminating eight reference colors, i.e., it is a relative measure of the shift in surface color of an object when lit by a particular lamp. The CRI Ra equals 100 if the color coordinates of a set of test colors being illuminated by the illumination system are the same as the coordinates of the same test colors being irradiated by the reference radiator. Daylight has a high CRI (Ra of approximately 100), with incandescent bulbs also being relatively close (Ra greater than 95), and fluorescent lighting being less accurate (typical Ra of 70-80). Certain types of specialized lighting have very low CRI (e.g., mercury vapor or sodium lamps have Ra as low as about 40 or even lower). Sodium lights are used, e.g., to light highways—driver response time, however, significantly decreases with lower CRI Ra values (for any given brightness, legibility decreases with lower CRI Ra).

Aspects related to the present inventive subject matter can be represented on either the 1931 CIE (Commission Internationale de l'Eclairage) Chromaticity Diagram or the 1976 CIE Chromaticity Diagram. Persons of skill in the art are familiar with these diagrams, and these diagrams are readily available (e.g., by searching "CIE Chromaticity Diagram" on the internet).

The CIE Chromaticity Diagrams map out the human color perception in terms of two CIE parameters x and y (in the case of the 1931 diagram) or u' and v' (in the case of the 1976 diagram). For a technical description of CIE chromaticity diagrams, see, for example, "Encyclopedia of Physical Science and Technology", vol. 7, 230-231 (Robert A Meyers ed., 1987). The spectral colors are distributed around the edge of the outlined space, which includes all of the hues perceived by the human eye. The boundary line represents maximum saturation for the spectral colors. The 1976 CIE Chromaticity Diagram is similar to the 1931 Diagram, except that the 1976 Diagram has been modified such that similar distances on the Diagram represent similar perceived differences in color.

In the 1931 Diagram, deviation from a point on the Diagram can be expressed either in terms of the x, y coordinates or, alternatively, in order to give an indication as to the extent of the perceived difference in color, in terms of MacAdam ellipses. For example, a locus of points defined as being ten MacAdam ellipses from a specified hue defined by a particular set of coordinates on the 1931 Diagram consists of hues that would each be perceived as differing from the specified hue to a common extent (and likewise for loci of points defined as being spaced from a particular hue by other quantities of MacAdam ellipses).

Since similar distances on the 1976 Diagram represent similar perceived differences in color, deviation from a point on the 1976 Diagram can be expressed in terms of the coordinates, u' and v', e.g., distance from the point=$(\Delta u'^2+\Delta v'^2)^{1/2}$, and the hues defined by a locus of points which are each a common distance from a specified hue consist of hues which would each be perceived as differing from the specified hue to a common extent.

A series of points that is commonly represented on the CM Diagrams is referred to as the blackbody locus. The chromaticity coordinates (i.e., color points) that lie along the blackbody locus obey Planck's equation: $E(\lambda)=A\,\lambda^{-5}/(e^{(B/T)}-1)$, where E is the emission intensity, $\lambda$ is the emission wavelength, T is the color temperature of the blackbody and A and B are constants. The 1976 CIE Diagram includes temperature listings along the blackbody locus. These temperature listings show the color path of a blackbody radiator that is caused to increase to such temperatures. As a heated object becomes incandescent, it first glows reddish, then yellowish, then white, and finally blueish. This occurs because the wavelength associated with the peak radiation of the blackbody radiator becomes progressively shorter with increased temperature, consistent with the Wien Displacement Law. Illuminants that produce light which is on or near the blackbody locus can thus be described in terms of their color temperature.

The most common type of general illumination is white light (or near white light), i.e., light that is close to the blackbody locus, e.g., within about ten MacAdam ellipses of the blackbody locus on a 1931 CIE Chromaticity Diagram.

Because light that is perceived as white is necessarily a blend of light of two or more colors (or wavelengths), no single light emitting diode junction has been developed that can produce white light. The emission spectrum of any particular light emitting diode is typically concentrated around a single wavelength (as dictated by the light emitting diode's composition and structure), which is desirable for some applications, but not desirable for others, (e.g., for providing general illumination, such an emission spectrum provides a very low CRI Ra). "White" solid state light emitting lamps have been produced by providing devices that mix different colors of light, e.g., by using light emitting diodes that emit light of differing respective colors and/or by converting some or all of the light emitted from the light emitting diodes using luminescent material. For example, as is well known, some lamps (referred to as "RGB lamps") use red, green and blue light emitting diodes, and other lamps use (1) one or more light emitting diodes that generate blue light and (2) luminescent material (e.g., one or more phosphor materials) that emits yellow light in response to excitation by light emitted by the light emitting diode, whereby the blue light and the yellow light, when mixed, produce light that is perceived as white light. While there is a need for more efficient white lighting, there is in general a need for more efficient lighting in all hues.

Narendran discloses, in "Color Rendering Properties of LED Light Sources," Narendran et al., Lighting Research Center, Rennselear Polytechnic Institute, Troy, N.Y. (2002) discloses RGB lamps that include light emitting diodes that emit light having wavelength of about 465 nm, light emitting diodes that emit light having wavelength of about 525 nm and light emitting diodes that emit light having wavelength of about 640 nm. Narendran also discloses RGB lamps that include light emitting diodes that emit light having wavelength of about 465 nm, light emitting diodes that emit light having wavelength of about 525 nm and light emitting diodes that emit light having wavelength of about 615 nm.

Although the development of light emitting diodes has in many ways revolutionized the lighting industry, some of the characteristics of light emitting diodes have presented challenges, some of which have not yet been fully met.

Accordingly, for these and other reasons, efforts have been ongoing to develop ways by which solid state light emitters, which may or may not include luminescent material(s), can be used in place of incandescent lights, fluorescent lights and other light-generating devices in a wide variety of applications. In addition, where light emitting diodes (or other solid state light emitters) are already being used, efforts are ongoing to provide solid state light emitters that are improved, e.g., with respect to energy efficiency, color rendering index (CRI Ra), contrast, efficacy (lm/W), and/or duration of service.

BRIEF SUMMARY OF THE INVENTIVE SUBJECT MATTER

RGB systems typically have low CRI Ra. RGB for natural objects tends to render poor color discrimination for objects (or portions of objects) that are colored red, green and/or blue (i.e., that reflect in those color ranges), as the increased color saturation of these primary colors in the light tends to overpower slight variations in color, with the result that objects that are colored similarly but slightly different tend to look the same.

The present inventor recognized that with regard to CRI Ra with neutral white and warm white illumination, the dominant wavelength of the green LED can be a limiting factor on the maximum CRI Ra that can be obtained. Currently, if the green LED emits light having a wavelength of about 525 nm, the maximum CRI Ra that is achievable is about 65. If instead a green LED is employed that emits light having a wavelength of about 550 nm, a CRI Ra of about 85 becomes achievable, and if a green LED is employed that emits light having a wavelength in the range of from about 555 nm to about 565 nm, a CRI Ra of about 90 becomes achievable.

In addition, the present inventor recognized that while an RGB lamp tends to saturate red, green and blue regions on objects being illuminated at the expense of color accuracy and color subtlety, many objects (especially materials printed in cyan, magenta and yellow), reflect colors that are not very close to the saturated colors of an RGB lamp. Objects that reflect such colors can be illuminated by an RGB lamp with excellent contrast, resulting in all colors being illuminated in a very vibrant and attractive way.

In accordance with one aspect of the present inventive subject matter, there is provided a lighting device comprising:
    a first group of solid state light emitters;
    a second group of solid state light emitters; and
    a third group of solid state light emitters.

In some embodiments according to the present inventive subject matter, there is provided a lighting device comprising:
    a first group of solid state light emitters;
    a second group of solid state light emitters; and
    a third group of solid state light emitters,
    the first group of solid state light emitters comprising at least a first solid state light emitter, each solid state light emitter in the first group of solid state light emitters emitting light having a dominant wavelength within a range of from about 430 nm to about 490 nm,
    the second group of solid state light emitters comprising at least a second solid state light emitter, each solid state light emitter in the second group of solid state light emitters emitting light having a dominant wavelength within a range of from about 540 nm to about 575 nm, and
    the third group of solid state light emitters comprising at least a third solid state light emitter, each solid state light emitter in the third group of solid state light emitters emitting light having a dominant wavelength within a range of from about 610 nm to about 640 nm.

In some embodiments according to the present inventive subject matter, there is provided a lighting device comprising:
    a first group of solid state light emitters;
    a second group of solid state light emitters; and
    a third group of solid state light emitters,
    the first group of solid state light emitters comprising at least a first solid state light emitter, each solid state light emitter in the first group of solid state light emitters emitting light having a dominant wavelength within a range of from about 430 nm to about 490 nm,
    the second group of solid state light emitters comprising at least a second solid state light emitter, each solid state light emitter in the second group of solid state light emitters emitting light having a dominant wavelength within a range of from about 525 nm to about 575 nm, and
    the third group of solid state light emitters comprising at least a third solid state light emitter, each solid state light emitter in the third group of solid state light emitters emitting light having a dominant wavelength within a range of from about 610 nm to about 640 nm,
    each solid state light emitter in the first group of solid state light emitters having a dominant wavelength that differs from a dominant wavelength of each solid state light emitter in the second group of solid state light emitters by at least 70 nm,
    each solid state light emitter in the second group of solid state light emitters having a dominant wavelength that differs from a dominant wavelength of each solid state light emitter in the third group of solid state light emitters by at least 70 nm.

In some embodiments according to the present inventive subject matter, there is provided a lighting arrangement comprising:
    a first group of solid state light emitters;
    a second group of solid state light emitters;
    a third group of solid state light emitters;
    at least a fourth solid state light emitter; and
    at least one item to be illuminated, the first group of solid state light emitters comprising at least a first solid state light emitter, each solid state light emitter in the first group of solid state light emitters emitting light having a dominant wavelength within a range of from about 430 nm to about 490 nm, the second group of solid state light emitters comprising at least a second solid state light emitter, each solid state light emitter in the second group of solid state light emitters emitting light having a dominant wavelength within a range of from about 525 nm to about 575 nm, and the third group of solid state light emitters comprising at least a third solid state light emitter, each solid state light emitter in the third group of solid state light emitters emitting light having a dominant wavelength within a range of from about 610 nm to about 640 nm, the fourth solid state light emitter emitting light that has a dominant wavelength that is outside each of the ranges of wavelength for the first, second and third groups of solid state light emitters, and not more than 10 nm different from a dominant wavelength of at least one color on the item to be illuminated.

In some embodiments according to the present inventive subject matter, there is provided a lighting device comprising:

a first group of solid state light emitters;

a second group of solid state light emitters; and a third group of solid state light emitters, the first group of solid state light emitters comprising at least a first solid state light emitter, each solid state light emitter in the first group of solid state light emitters emitting light having a dominant wavelength within a range of from about 430 nm to about 490 nm, the second group of solid state light emitters comprising at least a second solid state light emitter, each solid state light emitter in the second group of solid state light emitters emitting light having a dominant wavelength within a range of from about 525 nm to about 575 nm, and the third group of solid state light emitters comprising at least a third solid state light emitter, each solid state light emitter in the third group of solid state light emitters emitting light having a dominant wavelength within a range of from about 610 nm to about 640 nm, the lighting device emitting light having a CRI Ra of at least about 70 when at least the first group of solid state light emitters, the second group of solid state light emitters and the third group of solid state light emitters are illuminated.

In some embodiments according to the present inventive subject matter, including some embodiments that include or do not include any of the features as discussed above, a combination of light emitted by the first group of solid state light emitters, the second group of solid state light emitters and the third group of solid state light emitters is within ten MacAdam ellipses of at least one point on the blackbody locus.

In some embodiments according to the present inventive subject matter, including some embodiments that include or do not include any of the features as discussed above, light exiting the lighting device is within ten MacAdam ellipses of at least one point on the blackbody locus.

In some embodiments according to the present inventive subject matter, including some embodiments that include or do not include any of the features as discussed above, the first group of solid state light emitters, the second group of solid state light emitters and the third group of solid state light emitters comprise all of the light emitters in the lighting device.

In some embodiments according to the present inventive subject matter, including some embodiments that include or do not include any of the features as discussed above, the lighting device further comprises:

at least a fourth solid state light emitter that emits light that has a dominant wavelength that is outside each of the ranges of wavelength for the first, second and third groups of solid state light emitters, and a controller configured to adjust the intensity of light emitted by at least one solid state light emitter selected from among the first group of solid state light emitters, the second group of solid state light emitters, the third group of solid state light emitters and the fourth solid state light emitter, to maintain light emitted by the lighting device within ten MacAdam ellipses of at least one point on the blackbody locus.

In some embodiments according to the present inventive subject matter, including some embodiments that include or do not include any of the features as discussed above, the lighting device further comprises a controller configured to adjust the intensity of light emitted by at least one solid state light emitter selected from among the first group of solid state light emitters, the second group of solid state light emitters, the third group of solid state light emitters and the fourth solid state light emitter (if provided), to maintain light emitted by the lighting device within ten MacAdam ellipses of at least one point on the blackbody locus.

In some embodiments according to the present inventive subject matter, including some embodiments that include or do not include any of the features as discussed above, the at least one item to be illuminated (if provided) is printed matter and/or signage.

The inventive subject matter may be more fully understood with reference to the accompanying drawings and the following detailed description of the inventive subject matter.

BRIEF DESCRIPTION OF THE DRAWING FIGURES

DETAILED DESCRIPTION OF THE INVENTIVE SUBJECT MATTER

Figure 1:
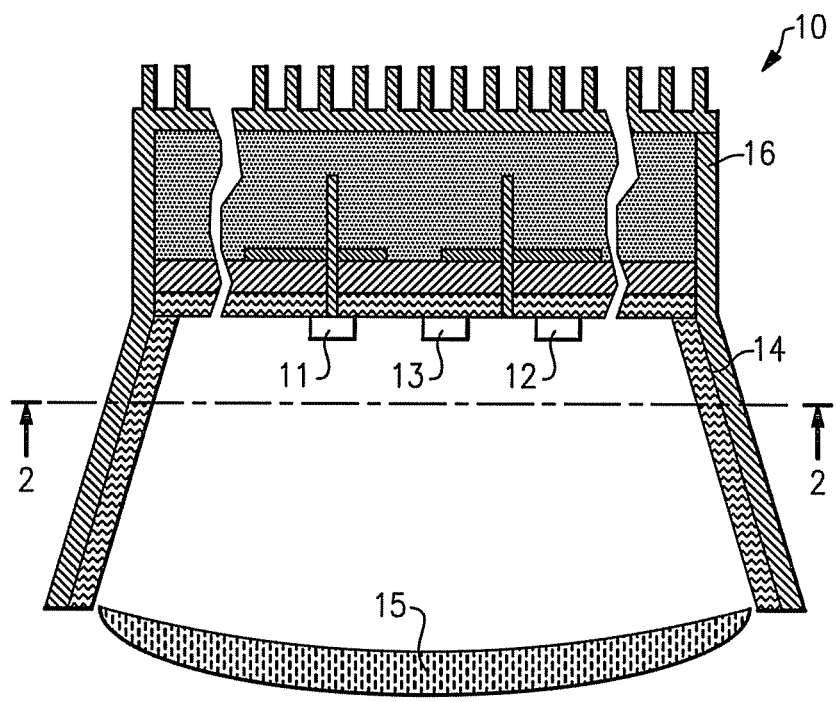
FIGS. 1 and 2 illustrate an embodiment of a lighting device 10 in accordance with the present inventive subject matter.

The present inventive subject matter now will be described more fully hereinafter with reference to the accompanying drawings, in which embodiments of the inventive subject matter are shown. However, this inventive subject matter should not be construed as limited to the embodiments set forth herein. Rather, these embodiments are provided so that this disclosure will be thorough and complete, and will fully convey the scope of the inventive subject matter to those skilled in the art. Like numbers refer to like elements throughout. As used herein the term "and/or" includes any and all combinations of one or more of the associated listed items.

The terminology used herein is for the purpose of describing particular embodiments only and is not intended to be limiting of the inventive subject matter. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

When an element such as a layer, region or substrate is referred to herein as being "on" or extending "onto" another element, it can be directly on or extend directly onto the other element or intervening elements may also be present. In contrast, when an element is referred to herein as being "directly on" or extending "directly onto" another element, there are no intervening elements present. Also, when an element is referred to herein as being "connected" or "coupled" to another element, it can be directly connected or coupled to the other element or intervening elements may be present. In contrast, when an element is referred to herein as being "directly connected" or "directly coupled" to another element, there are no intervening elements present. In addition, a statement that a first element is "on" a second element is synonymous with a statement that the second element is "on" the first element.

Although the terms "first", "second", etc. may be used herein to describe various elements, components, regions, layers, sections and/or parameters, these elements, components, regions, layers, sections and/or parameters should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive subject matter.

Relative terms, such as "lower", "bottom", "below", "upper", "top" or "above," may be used herein to describe one element's relationship to another elements as illustrated in the Figures. Such relative terms are intended to encompass different orientations of the device in addition to the orientation depicted in the Figures. For example, if the device in the Figures is turned over, elements described as being on the "lower" side of other elements would then be oriented on "upper" sides of the other elements. The exemplary term "lower", can therefore, encompass both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

The expression "lighting device", as used herein, is not limited, except that it indicates that the device is capable of emitting light. That is, a lighting device can be a device which illuminates an area or volume, e.g., a structure, a swimming pool or spa, a room, a warehouse, an indicator, a road, a parking lot, a vehicle, signage, e.g., road signs, a billboard, a ship, a toy, a mirror, a vessel, an electronic device, a boat, an aircraft, a stadium, a computer, a remote audio device, a remote video device, a cell phone, a tree, a window, an LCD display, a cave, a tunnel, a yard, a lamppost, or a device or array of devices that illuminate an enclosure, or a device that is used for edge or back-lighting (e.g., back light poster, signage, LCD displays), bulb replacements (e.g., for replacing AC incandescent lights, low voltage lights, fluorescent lights, etc.), lights used for outdoor lighting, lights used for security lighting, lights used for exterior residential lighting (wall mounts, post/column mounts), ceiling fixtures/wall sconces, under cabinet lighting, lamps (floor and/or table and/or desk), landscape lighting, track lighting, task lighting, specialty lighting, ceiling fan lighting, archival/art display lighting, high vibration/impact lighting—work lights, etc., mirrors/vanity lighting, or any other light emitting device.

The present inventive subject matter further relates to an illuminated enclosure (the volume of which can be illuminated uniformly or non-uniformly), comprising an enclosed space and at least one lighting device or lighting arrangement according to the present inventive subject matter, wherein the lighting device illuminates at least a portion of the enclosed space (uniformly or non-uniformly).

The present inventive subject matter is further directed to an illuminated surface, comprising a surface and at least one lighting device as described herein, wherein if the lighting device is illuminated, the lighting device would illuminate at least a portion of the surface.

The present inventive subject matter is further directed to an illuminated area or surface, comprising at least a portion of at least one item, or a surface thereof, e.g., selected from among the group consisting of a structure, a swimming pool or spa, a room, a warehouse, an indicator, a road, a parking lot, a vehicle, signage, e.g., road signs, a billboard, a ship, a toy, a mirror, a vessel, an electronic device, a boat, an aircraft, a stadium, a computer, a remote audio device, a remote video device, a cell phone, a tree, a window, an LCD display, a cave, a tunnel, a yard, a lamppost, etc., having mounted therein or thereon at least one lighting device or lighting arrangement as described herein.

The expression "illumination" (or "illuminated"), as used herein when referring to a solid state light emitter, means that at least some current is being supplied to the solid state light emitter to cause the solid state light emitter to emit at least some light. The expression "illuminated" encompasses situations where the solid state light emitter emits light continuously, or intermittently at a rate such that a human eye would perceive it as emitting light continuously or intermittently, or where a plurality of solid state light emitters of the same color or different colors are emitting light intermittently and/or alternatingly (with or without overlap in "on" times) in such a way that a human eye would perceive them as emitting light continuously or intermittently (and, in some cases where different colors are emitted, as a mixture of those colors).

The expression "excited", as used herein when referring to luminescent material, means that at least some electromagnetic radiation (e.g., visible light, UV light or infrared light) is contacting the luminescent material, causing the luminescent material to emit at least some light. The expression "excited" encompasses situations where the luminescent material emits light continuously, or intermittently at a rate such that a human eye would perceive it as emitting light continuously or intermittently, or where a plurality of luminescent materials of the same color or different colors are emitting light intermittently and/or alternatingly (with or without overlap in "on" times) in such a way that a human eye would perceive them as emitting light continuously or intermittently (and, in some cases where different colors are emitted, as a mixture of those colors).

Unless otherwise defined, all terms (including technical and scientific terms) used herein have the same meaning as commonly understood by one of ordinary skill in the art to which this inventive subject matter belongs. It will be further understood that terms, such as those defined in commonly used dictionaries, should be interpreted as having a meaning that is consistent with their meaning in the context of the relevant art and the present disclosure and will not be interpreted in an idealized or overly formal sense unless expressly so defined herein. It will also be appreciated by those of skill in the art that references to a structure or feature that is disposed "adjacent" another feature may have portions that overlap or underlie the adjacent feature.

As noted above, in some embodiments according to the present inventive subject matter, there are provided at least first, second and third groups of solid state light emitters, each solid state light emitter in the first group of solid state light emitters emitting light having a dominant wavelength within a range of from about 430 nm to about 490 nm, each solid state light emitter in the second group of solid state light emitters emitting light having a dominant wavelength within a range of from about 525 nm to about 575 nm, and each solid state light emitter in the third group of solid state light emitters emitting light having a dominant wavelength within a range of from about 610 nm to about 640 nm.

In some embodiments according to the present inventive subject matter, there are provided at least first, second and third groups of solid state light emitters, each solid state light emitter in the first group of solid state light emitters emitting light having a dominant wavelength within a range of from about 430 nm to about 490 nm, each solid state light emitter in the second group of solid state light emitters emitting light having a dominant wavelength within a range of from about 540 nm to about 575 nm, and each solid state light emitter in the third group of solid state light emitters emitting light having a dominant wavelength within a range of from about 610 nm to about 640 nm. In some embodiments, some or all of the first group of solid state light emitters emit light having a dominant wavelength within a range of from about 440 nm to about 490 nm, a range of from about 430 nm to about 480 nm, a range of from about 440 nm to about 480 nm, a range of from about 440 nm to about 470 nm, a range of from about 450 nm to about 480 nm, a range of from about 450 nm to about 470 nm, a range of from about 450 nm to about 460 nm, a range of from about 460 nm to about 470 nm, or a range of from about 455 nm to about 465 nm, and/or some or all of the second group of solid state light emitters emit light having a dominant wavelength within a range of from about 525 nm to about 575 nm, a range of from about 525 nm to about 565 nm, a range of from about 535 nm to about 575 nm, a range of from about 535 nm to about 565 nm, a range of from about 535 nm to about 555 nm, a range of from about 545 nm to about 565 nm, or a range of from about 545 nm to about 555 nm, and/or some or all of the third group of solid state light emitters emit light having a dominant wavelength within a range of from about 610 nm to about 640 nm, a range of from about 610 nm to about 630 nm, a range of from about 620 nm to about 640 nm, or a range of from about 620 nm to about 630 nm.

A variety of solid state light emitters are well known, and any of such light emitters can be employed according to the present inventive subject matter. Representative examples of solid state light emitters include light emitting diodes (inorganic or organic, including polymer light emitting diodes (PLEDs)) with or without luminescent materials. Persons of skill in the art are familiar with, and have ready access to, a variety of solid state light emitters which, when illuminated, emit light of any of a wide variety of wavelengths, ranges of wavelengths, dominant emission wavelengths and peak emission wavelength, and any of such solid state light emitters, or any combinations of such solid state light emitters, can be employed in the at least one light source or as a supplemental light emitter in accordance with the present inventive subject matter.

Light emitting diodes are semiconductor devices that convert electrical current into light. A wide variety of light emitting diodes are used in increasingly diverse fields for an ever-expanding range of purposes.

More specifically, light emitting diodes are semiconducting devices that emit light (ultraviolet, visible, or infrared) when a potential difference is applied across a p-n junction structure. There are a number of well-known ways to make light emitting diodes and many associated structures, and the present inventive subject matter can employ any such devices. By way of example, Chapters 12-14 of Sze, Physics of Semiconductor Devices, (2d Ed. 1981) and Chapter 7 of Sze, Modern Semiconductor Device Physics (1998) describe a variety of photonic devices, including light emitting diodes.

The expression "light emitting diode" is used herein to refer to the basic semiconductor diode structure (i.e., the chip). The commonly recognized and commercially available "LED" that is sold (for example) in electronics stores typically represents a "packaged" device made up of a number of parts. These packaged devices typically include a semiconductor based light emitting diode such as (but not limited to) those described in U.S. Pat. Nos. 4,918,487; 5,631,190; and 5,912,477; various wire connections, and a package that encapsulates the light emitting diode.

As is well known, a light emitting diode produces light by exciting electrons across the band gap between a conduction band and a valence band of a semiconductor active (light-emitting) layer. The electron transition generates light at a wavelength that depends on the band gap. Thus, the color of the light (wavelength) emitted by a light emitting diode depends on the semiconductor materials of the active layers of the light emitting diode.

Persons of skill in the art are familiar with, and have ready access to, and can readily make, a variety of light emitting diodes and other solid state light emitters that emit light within desired portions of the respective wavelength ranges described above, and any of such solid state light emitters can be employed in embodiments in accordance with the present inventive subject matter.

Some embodiments of the present inventive subject matter further comprise at least a fourth solid state light emitter that emits light that has a dominant wavelength that is outside each of the ranges of wavelength for the first, second and third groups of solid state light emitters. Persons of skill in the art are familiar with, and have ready access to, and can readily make, a variety of light emitting diodes and other solid state light emitters that emit light within desired wavelength ranges, and any of such solid state light emitters can be employed in embodiments in accordance with the present inventive subject matter.

Solid state light emitters employed in the lighting devices and lighting arrangements according to the present inventive subject matter can be selected from among solid state light emitters that have any suitable or desired full width half max (FWHM) values. Persons of skill in the art are familiar with FWHM values for solid state light emitters (e.g., representative, non-limiting values of typical InGaN and AlInGaP light emitting diodes are about 17 nm for red light-emitting solid state light emitters, about 32 nm for green light-emitting solid state light emitters and 20 nm for blue light-emitting solid state light emitters.

Representative examples of suitable solid state light emitters, including suitable light emitting diodes, and optionally including one or more luminescent materials and/or one or more encapsulants, etc., are described in:

U.S. patent application Ser. No. 11/614,180, filed Dec. 21, 2006 (now U.S. Patent Publication No. 2007/0236911), the entirety of which is hereby incorporated by reference as if set forth in its entirety;

U.S. patent application Ser. No. 11/624,811, filed Jan. 19, 2007 (now U.S. Patent Publication No. 2007/0170447), the entirety of which is hereby incorporated by reference as if set forth in its entirety;

U.S. patent application Ser. No. 11/751,982, filed May 22, 2007 (now U.S. Patent Publication No. 2007/0274080), the entirety of which is hereby incorporated by reference as if set forth in its entirety;

U.S. patent application Ser. No. 11/753,103, filed May 24, 2007 (now U.S. Patent Publication No. 2007/0280624), the entirety of which is hereby incorporated by reference as if set forth in its entirety;

U.S. patent application Ser. No. 11/751,990, filed May 22, 2007 (now U.S. Patent Publication No. 2007/0274063), the entirety of which is hereby incorporated by reference as if set forth in its entirety;

U.S. patent application Ser. No. 11/736,761, filed Apr. 18, 2007 (now U.S. Patent Publication No. 2007/0278934), the entirety of which is hereby incorporated by reference as if set forth in its entirety;

U.S. patent application Ser. No. 11/936,163, filed Nov. 7, 2007 (now U.S. Patent Publication No. 2008/0106895), the entirety of which is hereby incorporated by reference as if set forth in its entirety;

U.S. patent application Ser. No. 11/843,243, filed Aug. 22, 2007 (now U.S. Patent Publication No. 2008/0084685), the entirety of which is hereby incorporated by reference as if set forth in its entirety;

U.S. patent application Ser. No. 11/870,679, filed Oct. 11, 2007 (now U.S. Patent Publication No. 2008/0089053), the entirety of which is hereby incorporated by reference as if set forth in its entirety;

U.S. patent application Ser. No. 12/117,148, filed May 8, 2008 (now U.S. Patent Publication No. 2008/0304261), the entirety of which is hereby incorporated by reference as if set forth in its entirety; and U.S. patent application Ser. No. 12/017,676, filed on Jan. 22, 2008 (now U.S. Patent Publication No. 2009-0108269), the entirety of which is hereby incorporated by reference as if set forth in its entirety;

The lighting devices according to the present inventive subject matter can comprise any desired number of solid state light emitters. For example, a lighting device according to the present inventive subject matter can include 50 or more light emitting diodes, or can include 100 or more light emitting diodes, etc. Other embodiments may include fewer LEDs, and such could be small chip LEDs or high power LEDs; and, provided with sufficient heatsinking, could be operated at high currents.

In some embodiments according to the present inventive subject matter, each solid state light emitter in the first group of solid state light emitters having a dominant wavelength that differs from a dominant wavelength of each solid state light emitter in the second group of solid state light emitters by at least 70 nm, and each solid state light emitter in the second group of solid state light emitters having a dominant wavelength that differs from a dominant wavelength of each solid state light emitter in the third group of solid state light emitters by at least 70 nm. As noted above, persons of skill in the art are familiar with, and have ready access to, a variety of solid state light emitters which, when illuminated, emit light of any of a wide variety of wavelengths, ranges of wavelengths, dominant emission wavelengths and peak emission wavelength. Accordingly, persons of skill in the art can select solid state light emitters that emit light of desired wavelengths which differ by at least 70 nm from one another.

In some embodiments of lighting arrangements according to the present inventive subject matter, at least a fourth solid state light emitter is included that emits light that has a dominant wavelength that is outside each of the ranges of wavelength for the first, second and third groups of solid state light emitters, and not more than 10 nm different from a dominant wavelength of at least one color on an item to be illuminated. The dominant wavelength of a color on the item to be illuminated (i.e., of a color that the item reflects) is obtained by drawing a line segment originating at the point E (i.e., 0.333, 0.333) on the 1931 CIE Chromaticity Diagram, and passing through the color point of the color on the item to be illuminated, whereby the intersection of the line segment and the border of the Chromaticity Diagram indicates the dominant wavelength of the color on the item to be illuminated. The item to be illuminated can be any item, representative examples of which include printed matter, signage (e.g., as described in U.S. patent application Ser. No. 11/613,733, filed Dec. 20, 2006, now U.S. Patent Publication No. 2007/0137074, the entirety of which is hereby incorporated by reference as if set forth in its entirety), food products, saleable merchandise, works of art, plants, animals and humans.

Some embodiments of the present inventive subject matter further comprise a controller configured to adjust the intensity of light emitted by at least one solid state light emitter selected from among the first group of solid state light emitters, the second group of solid state light emitters, the third group of solid state light emitters and the fourth solid state light emitter, to maintain light emitted by the lighting device within ten MacAdam ellipses of at least one point on the blackbody locus.

Persons of skill in the art are familiar with, have access to, and can readily envision a variety of suitable controllers that can be used to adjust the intensity of light emitted by one of more solid state light emitters so as to maintain light emitted by the lighting device within any desired locus of points on the CIE Chromaticity Diagrams, and any of such controllers can be employed in accordance with the present inventive subject matter.

Representative examples of suitable controllers are described in:

U.S. patent application Ser. No. 11/755,149, filed May 30, 2007 (now U.S. Patent Publication No. 2007/0278974), the entirety of which is hereby incorporated by reference as if set forth in its entirety;

U.S. patent application Ser. No. 12/117,280, filed May 8, 2008 (now U.S. Patent Publication No. 2008/0309255), the entirety of which is hereby incorporated by reference as if set forth in its entirety; and U.S. patent application Ser. No. 12/257,804, filed on Oct. 24, 2008 (now U.S. Patent Publication No. 2009/0160363), the entirety of which is hereby incorporated by reference as if set forth in its entirety.

In some embodiments according to the present inventive subject matter, the lighting device further comprises a sensor which detects an intensity of light emitted by one or more solid state light emitters (or strings of solid state light emitters), and circuitry which adjusts a current supplied to such one or more solid state light emitters (or strings of solid state light emitters) in response to that intensity. Persons of skill in the art are familiar with a variety of sensors which can detect an intensity of light emitted by one or more solid state light emitters, and any of such sensors can be used in making or carrying out such embodiments. Similarly, persons of skill in the art are familiar with a variety of types of circuitry that can adjust a current supplied to one or more solid state light emitters (or strings of solid state light emitters), or that can adjust currents supplied independently to each of plural strings of solid state light emitters, in response to any signal or command (e.g., intensity detected by the sensor(s)), and any of such types of circuitry can be employed in the devices and arrangements according to the present inventive subject matter. For example, in some embodiments according to the present inventive subject matter, the current supplied to one or more solid state light emitters (or one or more strings of solid state lighting devices) can be set to a particular value for the intensity of the light (or combined light) emitted by one or more solid state light emitters, or by solid state light emitters in one or more strings of solid state light emitters as detected during testing (i.e., their initial combined intensity), and the current supplied to one or more other solid state light emitters (or one or more strings of solid state light emitters) can be varied (linearly or non-linearly) from that set value in response to variance in the intensity of the detected light emitted over time (e.g., as the intensity of one or more solid state light emitters (or one or more strings of solid state light emitters) decreases over time, the current supplied to one or more other solid state light emitters (or one or more other strings of solid state light emitters) can be varied in order to reduce or minimize deviation of the combined color output of the lighting device over time. Skilled artisans are familiar with a variety of ways to provide such a relationship, e.g., by providing a sensor feedback which, in response to variances in the intensity of the combined light emitted by one or more solid state light emitters (or one or more strings of solid state light emitters), adjusts a reference voltage for one or more other solid state light emitters (or one or more other strings of solid state light emitters).

Some embodiments of the present inventive subject matter include measuring color output of a lighting device while supplying current to the respective solid state light emitters (or one or more strings of solid state light emitters), and adjusting the current supplied to at least one of the solid state light emitters (or strings of solid state light emitters). Persons of skill in the art are familiar with a variety of devices and techniques for measuring color output, and any of such devices and techniques can be employed in the devices and methods according to the present inventive subject matter. Similarly, persons of skill in the art are familiar with a wide variety of devices and techniques for adjusting current supplied to one or more strings of solid state light emitters, and any of such devices and techniques can be employed in the devices and arrangements according to the present inventive subject matter. Thus, the currents are tunable based upon characteristics of the specific device (and components thereof) being used.

The light emission from many solid state light emitters, such as light emitting diodes, can vary in response to temperature of the light emitter and/or age of the light emitter. For instance, light emitting diodes that emit red light tend to experience a significant decrease in intensity as they become warmer, e.g., as a result of being operated for long periods of time. Some embodiments according to the present inventive subject matter comprise supplying current to one or more solid state light emitters (or to one or more strings of solid state light emitters) in a device prior to measuring a first color output, in order to allow the solid state light emitters to heat up to (or near to) a temperature to which they will typically be heated when the lighting device is illuminated, in order to account for variance in intensity of some solid state light emitters resulting from variance in temperature (e.g., the intensity of many solid state light emitters decreases as temperature increases, in at least some temperature ranges). The particular duration that current should be supplied to the solid state light emitters (prior to measuring the first color output) will depend on the particular configuration of the lighting device. For example, the greater the thermal mass, the longer it will take for the solid state light emitters to approach their thermal equilibrium operating temperature. While a specific time for operating the lighting device prior to testing may be lighting device specific, in some embodiments, durations of from about 1 to about 60 minutes or more and, in specific embodiments, about 30 minutes, may be used.

In some instances, color output from a solid state light emitter, or from a combination of solid state light emitters, or from an entire lighting device, can be analyzed after the solid state light emitters reach thermal equilibrium (e.g., while operating, the temperature of each of the solid state light emitters will not vary substantially (e.g., more than 2 degrees C.) without a change in ambient or operating conditions). In such a case, the color analysis is said to be "with the solid state light emitters at thermal equilibrium." As will be appreciated by those of skill in the art, the determination that a light emitter has reached thermal equilibrium may be made in many different ways. For example, the voltage across the light emitters may be measured. Thermal equilibrium may be reached when the voltage has stabilized. Similarly, when the wavelength output of the light emitters has stabilized, the light emitters will be at thermal equilibrium. Also, for phosphor converted LEDs, when the peak wavelengths of the phosphor component and the LED component have stabilized, the LEDs will be at thermal equilibrium.

In some instances, color output can be analyzed while the solid state light emitters (or the entire lighting device) is at ambient temperature, e.g., substantially immediately after the light emitter (or light emitters, or the entire lighting device) is illuminated. The expression "at ambient temperature", as used herein, means that the light emitter(s) is within 2 degrees C. of the ambient temperature. As will be appreciated by those of skill in the art, the "ambient temperature" measurement may be taken by measuring the light output of the device in the first few milliseconds or microseconds after the device is energized.

In some lighting devices according to the present inventive subject matter, there are further included one or more circuitry components, e.g., drive electronics for supplying and controlling current passed through at least one of the solid state light emitters in the lighting device. Persons of skill in the art are familiar with a wide variety of ways to supply and control the current passed through solid state light emitters, and any such ways can be employed in the devices of the present inventive subject matter. For example, such circuitry can include at least one contact, at least one leadframe, at least one current regulator, at least one power control, at least one voltage control, at least one boost, at least one capacitor and/or at least one bridge rectifier, persons of skill in the art being familiar with such components and being readily able to design appropriate circuitry to meet whatever current flow characteristics are desired.

Representative examples of apparatuses for supplying electricity to lighting devices and power supplies for lighting devices, all of which are suitable for the lighting devices and lighting arrangements of the present inventive subject matter, are described in:

U.S. patent application Ser. No. 11/626,483, filed Jan. 24, 2007 (now U.S. Patent Publication No. 2007/0171145), the entirety of which is hereby incorporated by reference as if set forth in its entirety;

U.S. patent application Ser. No. 11/755,162, filed May 30, 2007 (now U.S. Patent Publication No. 2007/0279440), the entirety of which is hereby incorporated by reference as if set forth in its entirety;

U.S. patent application Ser. No. 11/854,744, filed Sep. 13, 2007 (now U.S. Patent Publication No. 2008/0088248), the entirety of which is hereby incorporated by reference as if set forth in its entirety;

U.S. patent application Ser. No. 12/117,280, filed May 8, 2008 (now U.S. Patent Publication No. 2008/0309255), the entirety of which is hereby incorporated by reference as if set forth in its entirety; and U.S. patent application Ser. No. 12/328,144, filed Dec. 4, 2008 (now U.S. Patent Publication No. 2009/0184666), the entirety of which is hereby incorporated by reference as if set forth in its entirety.

The lighting devices according to the present inventive subject matter can further comprise any desired electrical connector, a wide variety of which are familiar to those of skill in the art, e.g., an Edison connector (for insertion in an Edison socket), a GU-24 connector, etc., or may be directly wired to an electrical branch circuit.

In some embodiments according to the present inventive subject matter, the lighting device is a self-ballasted device. For example, in embodiments, the lighting device can be directly connected to AC current (e.g., by being plugged into a wall receptacle, by being screwed into an Edison socket, by being hard-wired into a branch circuit, etc.). Representative examples of self-ballasted devices are described in U.S. patent application Ser. No. 11/947,392, filed on Nov. 29, 2007 (now U.S. Patent Publication No. 2008/0130298), the entirety of which is hereby incorporated by reference as if set forth in its entirety.

The lighting devices according to the present inventive subject matter can be of any type, a variety of which are well known to persons of skill in the art. In some embodiments according to the present inventive subject matter, the lighting device is (or the lighting arrangement comprises) a PAR light, a strip light, a downlight or a portable light.

Some embodiments in accordance with the present inventive subject matter employ one or more enclosing structures that surround one or more of the solid state light emitters, and/or one or more reflective element, and/or one or more housings. In addition, the present inventive subject matter provides fixtures that comprise one or more lighting devices in accordance with the present inventive subject matter.

Persons of skill in the art are familiar with, and can readily envision, and have ready access to, a variety of enclosing structures, and any of such enclosing structures can be employed in embodiments in accordance with the present inventive subject matter.

Persons of skill in the art are familiar with, and can readily envision, and have ready access to, a variety of reflective elements, and any of such reflective elements can be employed in embodiments in accordance with the present inventive subject matter. Persons of skill in the art are familiar with, and can readily obtain, a wide variety of reflective materials for use in such reflective elements. A representative example of a suitable reflective material for such purposes is a material marketed by Furukawa (a Japanese corporation) under the trademark MCPET®.

Persons of skill in the art are familiar with, and can envision, a wide variety of materials out of which a housing can be constructed, and a wide variety of shapes for such housings, and housings made of any of such materials and having any of such shapes can be employed in accordance with the present inventive subject matter. In some embodiments that include a housing, at least a portion of the internal surface of the housing is highly reflective. As noted above, persons of skill in the art are familiar with, and can readily obtain, a wide variety of reflective materials, and any of such materials can be used in making such housings.

Persons of skill in the art are familiar with, and can readily envision, and have ready access to, a variety of components that can be used in making fixtures, and any of such fixture components can be employed in embodiments of fixtures in accordance with the present inventive subject matter.

For example, fixtures, other mounting structures and complete lighting assemblies which may be used in practicing the present inventive subject matter are described in:

U.S. patent application Ser. No. 11/613,692, filed Dec. 20, 2006 (now U.S. Patent Publication No. 2007/0139923), the entirety of which is hereby incorporated by reference as if set forth in its entirety;

U.S. patent application Ser. No. 11/743,754, filed May 3, 2007 (now U.S. Patent Publication No. 2007/0263393), the entirety of which is hereby incorporated by reference as if set forth in its entirety;

U.S. patent application Ser. No. 11/755,153, filed May 30, 2007 (now U.S. Patent Publication No. 2007/0279903), the entirety of which is hereby incorporated by reference as if set forth in its entirety;

U.S. patent application Ser. No. 11/856,421, filed Sep. 17, 2007 (now U.S. Patent Publication No. 2008/0084700), the entirety of which is hereby incorporated by reference as if set forth in its entirety;

U.S. patent application Ser. No. 11/859,048, filed Sep. 21, 2007 (now U.S. Patent Publication No. 2008/0084701), the entirety of which is hereby incorporated by reference as if set forth in its entirety;

U.S. patent application Ser. No. 11/939,047, filed Nov. 13, 2007 (now U.S. Patent Publication No. 2008/0112183), the entirety of which is hereby incorporated by reference as if set forth in its entirety;

U.S. patent application Ser. No. 11/939,052, filed Nov. 3, 2007 (now U.S. Patent Publication No. 2008/0112168), the entirety of which is hereby incorporated by reference as if set forth in its entirety;

U.S. patent application Ser. No. 11/939,059, filed Nov. 13, 2007 (now U.S. Patent Publication No. 2008/0112170), the entirety of which is hereby incorporated by reference as if set forth in its entirety;

U.S. patent application Ser. No. 11/877,038, filed Oct. 23, 2007 (now U.S. Patent Publication No. 2008/0106907), the entirety of which is hereby incorporated by reference as if set forth in its entirety;

U.S. patent application Ser. No. 60/861,901, filed on Nov. 30, 2006, entitled "LED DOWNLIGHT WITH ACCESSORY ATTACHMENT" (inventors: Gary David Trott, Paul Kenneth Pickard and Ed Adams), the entirety of which is hereby incorporated by reference as if set forth in its entirety;

U.S. patent application Ser. No. 11/948,041, filed Nov. 30, 2007 (now U.S. Patent Publication No. 2008/0137347), the entirety of which is hereby incorporated by reference as if set forth in its entirety;

U.S. patent application Ser. No. 12/114,994, filed May 5, 2008 (now U.S. Patent Publication No. 2008/0304269), the entirety of which is hereby incorporated by reference as if set forth in its entirety;

U.S. patent application Ser. No. 12/116,341, filed May 7, 2008 (now U.S. Patent Publication No. 2008/0278952), the entirety of which is hereby incorporated by reference as if set forth in its entirety;

U.S. patent application Ser. No. 12/116,346, filed May 7, 2008 (now U.S. Patent Publication No. 2008/0278950), the entirety of which is hereby incorporated by reference as if set forth in its entirety;

U.S. patent application Ser. No. 12/116,348, filed on May 7, 2008 (now U.S. Patent Publication No. 2008/0278957), the entirety of which is hereby incorporated by reference as if set forth in its entirety;

U.S. patent application Ser. No. 61/108,130, filed on Oct. 24, 2008, entitled "LIGHTING DEVICE WHICH INCLUDES ONE OR MORE SOLID STATE LIGHT EMITTING DEVICE" (inventors: Antony Paul van de Ven and Gerald H. Negley), the entirety of which is hereby incorporated by reference as if set forth in its entirety;

U.S. patent application Ser. No. 61/108,133, filed on Oct. 24, 2008, entitled "LIGHTING DEVICE" (inventors: Gerald H. Negley and Antony Paul van de Ven), the entirety of which is hereby incorporated by reference as if set forth in its entirety; and U.S. patent application Ser. No. 61/108,149, filed on Oct. 24, 2008, entitled "LIGHTING DEVICE, HEAT TRANSFER STRUCTURE AND HEAT TRANSFER ELEMENT" (inventors: Antony Paul van de Ven and Gerald H. Negley), the entirety of which is hereby incorporated by reference as if set forth in its entirety.

Lighting devices or lighting arrangements according to the present inventive subject matter can, if desired, further comprise one or more luminescent materials. Persons of skill in the art are familiar with, and have ready access to, a variety of luminescent materials that emit light having a desired peak emission wavelength and/or dominant emission wavelength, or a desired hue, and any of such luminescent materials, or any combinations of such luminescent materials, can be employed, if desired. For example, a variety of phosphors are readily available, such phosphors each being a luminescent material that emits a responsive radiation (e.g., visible light) when excited by a source of exciting radiation. In many instances, the responsive radiation has a wavelength which is different from the wavelength of the exciting radiation. Other examples of luminescent materials include scintillators, day glow tapes and inks which glow in the visible spectrum upon illumination with ultraviolet light.

Luminescent materials can be categorized as being down-converting, i.e., a material which converts photons to a lower energy level (longer wavelength) or up-converting, i.e., a material which converts photons to a higher energy level (shorter wavelength).

In some embodiments, one or more luminescent material can be included within a packaged solid state light emitter in any of a variety of ways known to persons of skill in the art, one representative way being by adding the luminescent materials to a clear or transparent encapsulant material (e.g., epoxy-based, silicone-based, glass-based or metal oxide-based material) as discussed above, for example by a blending or coating process, prior to solidifying the encapsulant material.

Some embodiments in accordance with the present inventive subject matter include one or more lenses or diffusers. Persons of skill in the art are familiar with a wide variety of lenses and diffusers, and can readily envision a variety of materials out of which a lens or a diffuser can be made, and are familiar and/or can envision a wide variety of shapes that lenses and diffusers can be. Any of such materials and/or shapes can be employed in a lens and/or a diffuser in an embodiment that includes a lens and/or a diffuser. As will be understood by persons skilled in the art, a lens or a diffuser in a lighting device according to the present inventive subject matter can be selected to have any desired effect on incident light (or no effect), such as focusing, diffusing, etc.

In embodiments in accordance with the present inventive subject matter that include one or more lenses and/or one or more diffusers, the lens(es) and/or the diffuser(s) can be positioned in any desired location and orientation.

In some embodiments in accordance with the present inventive subject matter, some or all of the energy supplied to the at least one light source and/or the first group of solid state light emitters is supplied by one or more batteries and/or by one or more photovoltaic energy collection device (i.e., a device which includes one or more photovoltaic cells which converts energy from the sun into electrical energy).

Embodiments in accordance with the present inventive subject matter are described herein with reference to cross-sectional (and/or plan view) illustrations that are schematic illustrations of idealized embodiments of the present inventive subject matter. As such, variations from the shapes of the illustrations as a result, for example, of manufacturing techniques and/or tolerances, are to be expected. Thus, embodiments of the present inventive subject matter should not be construed as limited to the particular shapes of regions illustrated herein but are to include deviations in shapes that result, for example, from manufacturing. For example, a molded region illustrated or described as a rectangle will, typically, have rounded or curved features. Thus, the regions illustrated in the figures are schematic in nature and their shapes are not intended to illustrate the precise shape of a region of a device and are not intended to limit the scope of the present inventive subject matter.

FIG. 1 illustrates an embodiment of a lighting device 10 in accordance with the present inventive subject matter. The lighting device 10 comprises a first group of solid state light emitters, a second group of solid state light emitters and a third group of solid state light emitters.

The first group of solid state light emitters can comprise a plurality of first solid state light emitters 11. Each first solid state light emitter 11 can emit light having a dominant wavelength within the range of from about 430 nm to about 490 nm.

The second group of solid state light emitters can comprise a plurality of second solid state light emitters 12. Each second solid state light emitter 12 can emit light having a dominant wavelength within the range of from about 540 nm to about 575 nm.

The third group of solid state light emitters can comprise a plurality of third solid state light emitters 13. Each third solid state light emitter 13 can emit light having a dominant wavelength within a range of from about 610 nm to about 640 nm.

Figure 2:
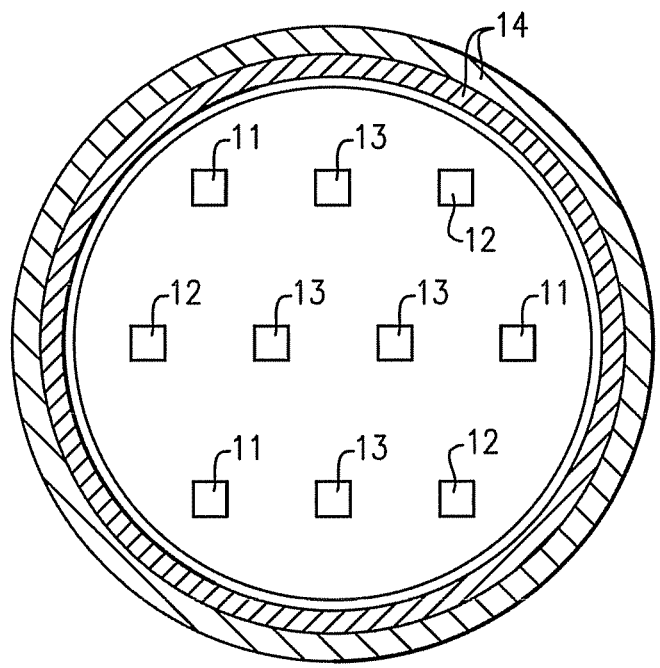

Only a single one of each group of light emitters is visible in FIG. 1. FIG. 2 is a view taken along the plane 2-2 in FIG. 1, looking upward (in the orientation depicted in FIG. 1) into the lighting device 10, and shows the plurality of first solid state light emitters 11, the plurality of second solid state light emitters 12 and the plurality of third solid state light emitters 13.

In some embodiments, apart from the first group of solid state light emitters 11, the second group of solid state light emitters 12 and the third group of solid state light emitters 13, the lighting device 10 may include no other light emitters, i.e., the first group of solid state light emitters 11, the second group of solid state light emitters 12 and the third group of solid state light emitters 13 comprise all of the light emitters in the lighting device 10.

In some embodiments, a combination of light emitted by the first group of solid state light emitters 11, the second group of solid state light emitters 12 and the third group of solid state light emitters 13 may be within ten MacAdam ellipses of at least one point on the blackbody locus, and light exiting the lighting device 10 may be within ten MacAdam ellipses of at least one point on the blackbody locus.

In some embodiments, the lighting device 10 can further comprise a lighting device housing 14, a lens 15 and a light engine housing 16. The lighting device housing 14 can have an internal surface that is reflective.

Figure 3:
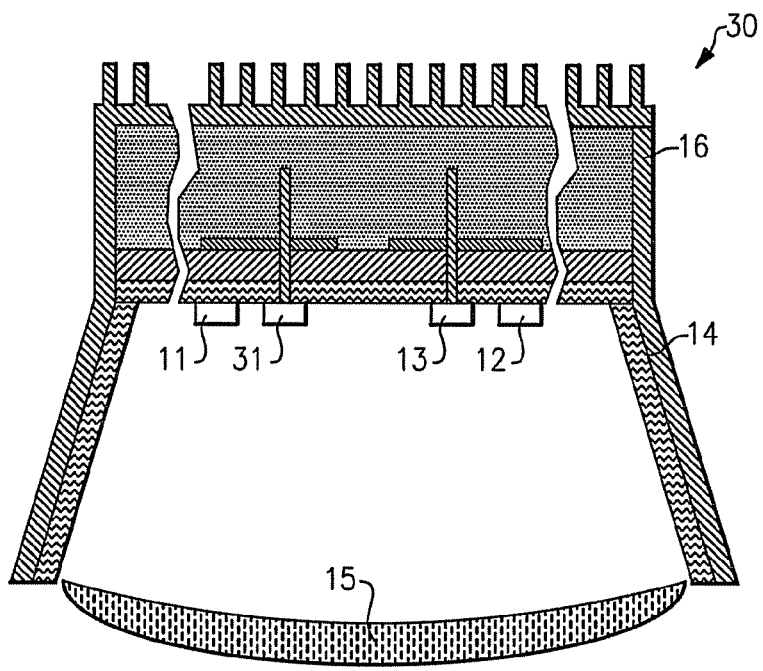
FIGS. 3 and 4 illustrate an embodiment of a lighting device 30 in accordance with the present inventive subject matter.
Figure 4:
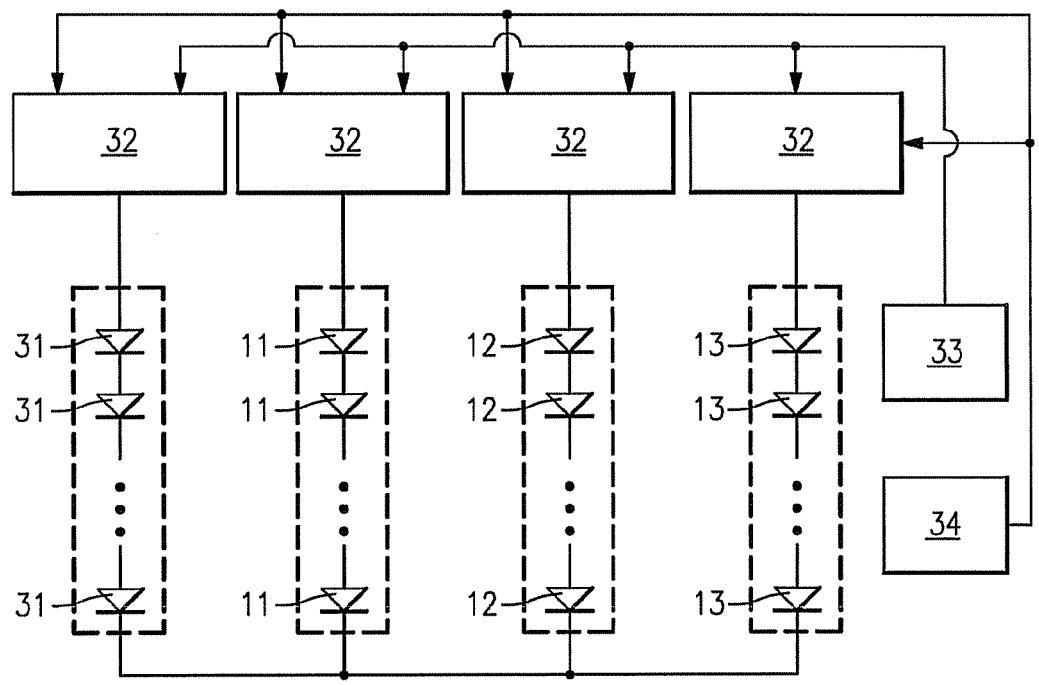

FIGS. 3 and 4 illustrate a lighting device 30 in accordance with the present inventive subject matter. The lighting device 30 is similar to the lighting device 10 depicted in FIG. 1, except that the lighting device 30 can further comprise a plurality of fourth solid state light emitters 31 (only one is visible in FIG. 3) and controllers 32. The fourth solid state light emitters 31 emit light that has a dominant wavelength that is outside each of the ranges of wavelength for the first, second and third groups of solid state light emitters 11, 12 and 13.

FIG. 4 is a schematic diagram of a circuit that includes the controllers 32 that are configured to adjust the respective intensities of light emitted by the first solid state light emitters 11, the second solid state light emitters 12, the third solid state light emitters 13 and the fourth solid state light emitters 31, to maintain light emitted by the lighting device 30 within ten MacAdam ellipses of at least one point on the blackbody locus. In some embodiments, the lighting device 30 can include a light sensor 33 and/or a temperature sensor 34.

Figure 5:
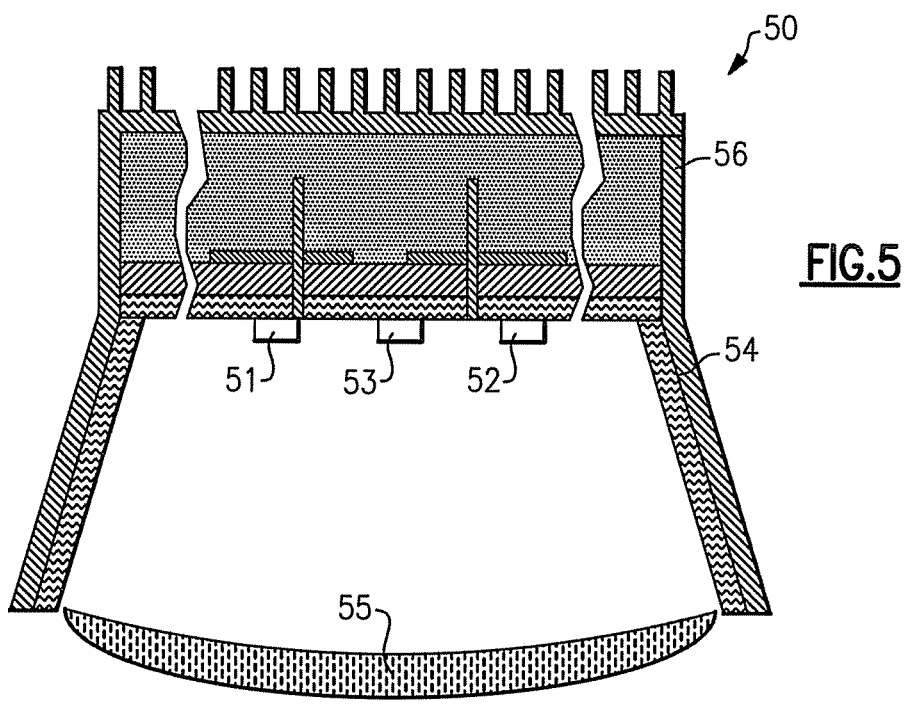
FIG. 5 illustrates an embodiment of a lighting device 50 in accordance with the present inventive subject matter.

FIG. 5 illustrates an embodiment of a lighting device 50 in accordance with the present inventive subject matter. The lighting device 50 comprises a first group of solid state light emitters, a second group of solid state light emitters and a third group of solid state light emitters.

The first group of solid state light emitters can comprise a plurality of first solid state light emitters 51. Each first solid state light emitter 51 can emit light having a dominant wavelength within the range of from about 430 nm to about 490 nm.

The second group of solid state light emitters can comprise a plurality of second solid state light emitters 52. Each second solid state light emitter 52 can emit light having a dominant wavelength within the range of from about 525 nm to about 575 nm.

The third group of solid state light emitters can comprise a plurality of third solid state light emitters 53. Each third solid state light emitter 53 can emit light having a dominant wavelength within a range of from about 610 nm to about 640 nm.

Each of the first solid state light emitters 51 can have a dominant wavelength that differs from a dominant wavelength of each of the second solid state light emitters 52 by at least 70 nm, and each of the second solid state light emitters 52 can have a dominant wavelength that differs from a dominant wavelength of each of the third solid state light emitters 53 by at least 70 nm.

In some embodiments, apart from the first group of solid state light emitters 51, the second group of solid state light emitters 52 and the third group of solid state light emitters 53, the lighting device 50 may include no other light emitters, i.e., the first group of solid state light emitters 51, the second group of solid state light emitters 52 and the third group of solid state light emitters 53 comprise all of the light emitters in the lighting device 50.

In some embodiments, a combination of light emitted by the first group of solid state light emitters 51, the second group of solid state light emitters 52 and the third group of solid state light emitters 53 may be within ten MacAdam ellipses of at least one point on the blackbody locus, and light exiting the lighting device 10 may be within ten MacAdam ellipses of at least one point on the blackbody locus.

In some embodiments, the lighting device 50 can further comprise a lighting device housing 54, a lens 55 and a light engine housing 56. The lighting device housing 54 can have an internal surface that is reflective.

Figure 6:
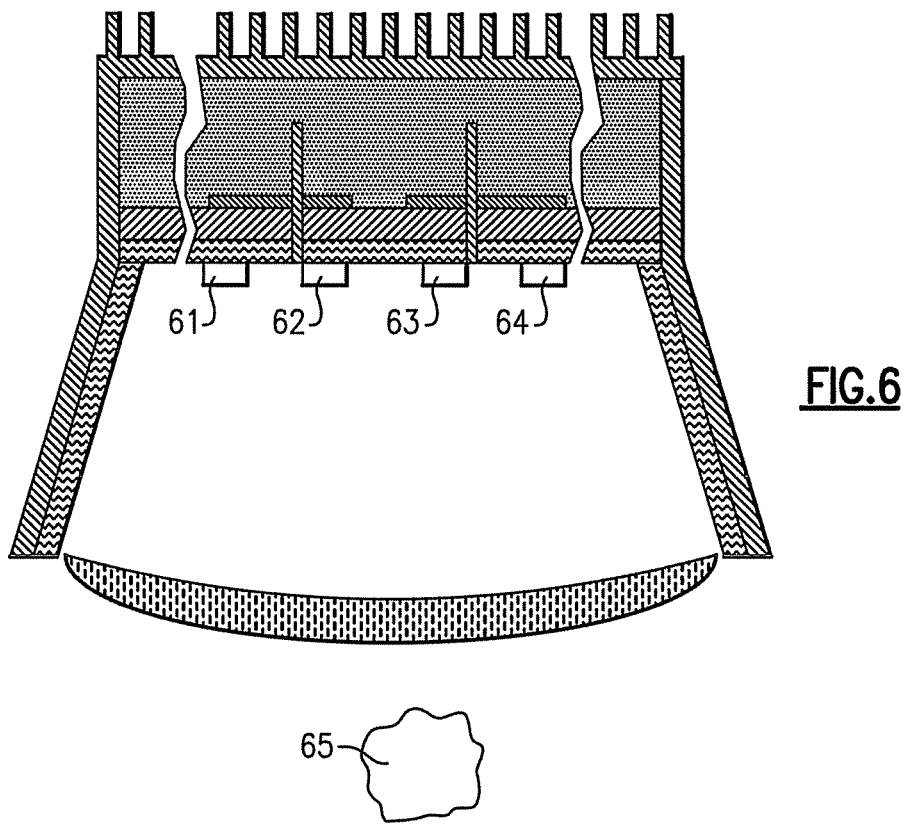
FIG. 6 illustrates an embodiment of a lighting device 60 in accordance with the present inventive subject matter.

FIG. 6 illustrates an embodiment of a lighting device 60 in accordance with the present inventive subject matter. The lighting device 60 comprises a first group of solid state light emitters, a second group of solid state light emitters, a third group of solid state light emitters, a fourth group of solid state light emitters, and an item 65 to be illuminated.

The first group of solid state light emitters can comprise a plurality of first solid state light emitters 61. Each first solid state light emitter 61 can emit light having a dominant wavelength within the range of from about 430 nm to about 490 nm.

The second group of solid state light emitters can comprise a plurality of second solid state light emitters 62. Each second solid state light emitter 62 can emit light having a dominant wavelength within the range of from about 525 nm to about 575 nm.

The third group of solid state light emitters can comprise a plurality of third solid state light emitters 63. Each third solid state light emitter 63 can emit light having a dominant wavelength within a range of from about 610 nm to about 640 nm.

The fourth group of solid state light emitters can comprise a plurality of fourth solid state light emitters 64. Each fourth solid state light emitter 64 can emit light having a dominant wavelength that is outside each of the ranges of wavelength for the first, second and third groups of solid state light emitters, and not more than 10 nm different from a dominant wavelength of at least one color on the item to be illuminated.

In some embodiments, a combination of light emitted by the first group of solid state light emitters 61, the second group of solid state light emitters 62, the third group of solid state light emitters 63, and the fourth group of solid state light emitters may be within ten MacAdam ellipses of at least one point on the blackbody locus, and light exiting the lighting device 60 may be within ten MacAdam ellipses of at least one point on the blackbody locus.

In some embodiments, the lighting device 60 can further comprise a controller configured to adjust the intensity of light emitted by at least one solid state light emitter selected from among the first group of solid state light emitters 61, the second group of solid state light emitters 62, the third group of solid state light emitters 63 and the fourth group of solid state light emitters 64, to maintain light emitted by the lighting device within ten MacAdam ellipses of at least one point on the blackbody locus.

In FIG. 6, the item 65 to be illuminated can be, as a representative example, a head of lettuce (for example, positioned in a display in a produce section of a grocery store), and the fourth group of solid state light emitters can emit light having a dominant wavelength of about 547 nm. In a representative example, the head of lettuce might have a color point of 0.33, 0.42 in the 1931 CIE Chromaticity Diagram. The color point of 0.33, 0.42 corresponds to a dominant wavelength of about 547 nm (i.e., a line segment originating at the origin (0.333, 0.333) and passing through the point 0.33, 0.42 would intersect the border of the 1931 Chromaticity Diagram at roughly the point corresponding to saturated light at 547 nm (i.e., a mixture of one part saturated green light at 547 nm with four parts white light having color coordinates of 0.333, 0.333 would result in approximately the color of the head of lettuce 65. Alternatively, the item 65 could be any other item of any other color or colors, e.g., printed matter, signage, another food product, etc.

Furthermore, while certain embodiments of the present inventive subject matter have been illustrated with reference to specific combinations of elements, various other combinations may also be provided without departing from the teachings of the present inventive subject matter. Thus, the present inventive subject matter should not be construed as being limited to the particular exemplary embodiments described herein and illustrated in the Figures, but may also encompass combinations of elements of the various illustrated embodiments.

Many alterations and modifications may be made by those having ordinary skill in the art, given the benefit of the present disclosure, without departing from the spirit and scope of the inventive subject matter. Therefore, it must be understood that the illustrated embodiments have been set forth only for the purposes of example, and that it should not be taken as limiting the inventive subject matter as defined by the following claims. The following claims are, therefore, to be read to include not only the combination of elements which are literally set forth but all equivalent elements for performing substantially the same function in substantially the same way to obtain substantially the same result. The claims are thus to be understood to include what is specifically illustrated and described above, what is conceptually equivalent, and also what incorporates the essential idea of the inventive subject matter.

Any two or more structural parts of the lighting device or lighting arrangements described herein can be integrated. Any structural part of the lighting device or lighting arrangements described herein can be provided in two or more parts which can be held together, if necessary.

The invention claimed is:

1. A lighting device comprising:
a first group of solid state light emitters;
a second group of solid state light emitters; and
a third group of solid state light emitters,
the first group of solid state light emitters comprising at least a first solid state light emitter, each solid state light emitter in the first group of solid state light emitters emitting light having a dominant wavelength within a range of from about 430 nm to about 490 nm,
the second group of solid state light emitters comprising at least a second solid state light emitter, each solid state light emitter in the second group of solid state light emitters emitting light having a dominant wavelength within a range of from about 525 nm to about 575 nm, and
the third group of solid state light emitters comprising at least a third solid state light emitter, each solid state light emitter in the third group of solid state light emitters emitting light having a dominant wavelength within a range of from about 610 nm to about 640 nm,
each solid state light emitter in the second group of solid state light emitters having a dominant wavelength that differs from a dominant wavelength of each solid state light emitter in the third group of solid state light emitters by at least 70 nm.

2. A lighting device as recited in claim 1, wherein a combination of light emitted by the first group of solid state light emitters, the second group of solid state light emitters and the third group of solid state light emitters is within ten MacAdam ellipses of at least one point on the blackbody locus.

3. A lighting device as recited in claim 1, wherein the first group of solid state light emitters, the second group of solid state light emitters and the third group of solid state light emitters comprise all of the light emitters in the lighting device.

4. A lighting device as recited in claim 1, wherein the lighting device further comprises:
at least a fourth solid state light emitter that emits light that has a dominant wavelength that is outside each of the ranges of wavelength for the first, second and third groups of solid state light emitters, and
a controller configured to adjust the intensity of light emitted by at least one solid state light emitter selected from among the first group of solid state light emitters, the second group of solid state light emitters, the third group of solid state light emitters and the fourth solid state light emitter, to maintain light emitted by the lighting device within ten MacAdam ellipses of at least one point on the blackbody locus.

5. An illuminated enclosure, comprising an enclosed space and at least one lighting device as recited in claim 1, wherein said lighting device illuminates at least a portion of said enclosed space.

6. An illuminated surface, comprising a surface and at least one lighting device as recited in claim 1, wherein if said lighting device is illuminated, said lighting device would illuminate at least a portion of said surface.

7. An illuminated area, comprising at least one item selected from among the group consisting of a swimming pool, a room, a warehouse, an indicator, a road, a vehicle, a road sign, a billboard, a ship, a toy, a minor, a vessel, an electronic device, a boat, an aircraft, a stadium, a computer, a remote audio device, a remote video device, a cell phone, a tree, a window, a yard, a lamppost, an indicator light, or a device or array of devices that illuminate an enclosure, or a device that is used for edge or back-lighting, having mounted therein or thereon at least one lighting device as recited in claim 1.

8. A lighting device as recited in claim 1, wherein each solid state light emitter in the first group of solid state light emitters has a dominant wavelength that differs from a dominant wavelength of each solid state light emitter in the second group of solid state light emitters by at least 70 nm.

9. A lighting arrangement comprising:
a lighting device; and
at least a first item which is illuminated when said lighting device emits light, said lighting device comprising:
a first group of solid state light emitters;
a second group of solid state light emitters;
a third group of solid state light emitters; and
at least a fourth light source,
the first group of solid state light emitters comprising at least a first solid state light emitter, each solid state light emitter in the first group of solid state light emitters emitting light having a dominant wavelength within a range of from about 430 nm to about 490 nm,
the second group of solid state light emitters comprising at least a second solid state light emitter, each solid state light emitter in the second group of solid state light emitters emitting light having a dominant wavelength within a range of from about 525 nm to about 575 nm,
the third group of solid state light emitters comprising at least a third solid state light emitter, each solid state light emitter in the third group of solid state light emitters emitting light having a dominant wavelength within a range of from about 610 nm to about 640 nm,
the fourth light source emitting light that has a dominant wavelength that is outside each of the ranges of wavelength for the first, second and third groups of solid state light emitters, and not more than 10 nm different from a dominant wavelength of at least one color on the first item, each solid state light emitter in the second group of solid state light emitters having a dominant wavelength that differs from a dominant wavelength of each solid state light emitter in the third group of solid state light emitters by at least 70 nm.

10. A lighting arrangement as recited in claim 9, wherein a combination of light emitted by the first group of solid state light emitters, the second group of solid state light emitters, the third group of solid state light emitters and the fourth light source is within ten MacAdam ellipses of at least one point on the blackbody locus.

11. A lighting arrangement as recited in claim 9, wherein:
the fourth light source comprises a fourth group of solid state light emitters, and
the lighting device further comprises a controller configured to adjust the intensity of light emitted by at least one solid state light emitter selected from among the first group of solid state light emitters, the second group of solid state light emitters, the third group of solid state light emitters and the fourth group of solid state light emitters, to maintain light emitted by the lighting device within ten MacAdam ellipses of at least one point on the blackbody locus.

12. A lighting arrangement as recited in claim 9, wherein the first item is selected from the group consisting of printed matter, signage, food products, saleable merchandise, works of art, plants, animals and humans.

13. An illuminated enclosure, comprising an enclosed space and at least one lighting arrangement as recited in claim 9, wherein said lighting arrangement illuminates at least a portion of said enclosed space.

14. An illuminated surface, comprising a surface and at least one lighting arrangement as recited in claim 9, wherein if said lighting arrangement is illuminated, said lighting arrangement would illuminate at least a portion of said surface.

15. An illuminated area, comprising at least one item selected from among the group consisting of a swimming pool, a room, a warehouse, an indicator, a road, a vehicle, a road sign, a billboard, a ship, a toy, a mirror, a vessel, an electronic device, a boat, an aircraft, a stadium, a computer, a remote audio device, a remote video device, a cell phone, a tree, a window, a yard, a lamppost, an indicator light, or a device or array of devices that illuminate an enclosure, or a device that is used for edge or back-lighting, having mounted therein or thereon at least one lighting arrangement as recited in claim 9.

16. A lighting arrangement as recited in claim 9, wherein said fourth light source comprises at least one solid state light emitter.

17. A lighting arrangement as recited in claim 9, wherein said fourth light source comprises a luminescent material.

18. A lighting arrangement as recited in claim 9, wherein the first group of solid state light emitters, the second group of solid state light emitters, the third group of solid state light emitters and the fourth light source comprise all of the light emitters in the lighting device.

19. A lighting device comprising:
a first group of solid state light emitters;
a second group of solid state light emitters;
a third group of solid state light emitters; and
a fourth light source,
the first group of solid state light emitters comprising at least a first solid state light emitter, each solid state light emitter in the first group of solid state light emitters emitting light having a dominant wavelength within a range of from about 430 nm to about 490 nm, the second group of solid state light emitters comprising at least a second solid state light emitter, each solid state light emitter in the second group of solid state light emitters emitting light having a dominant wavelength within a range of from about 525 nm to about 575 nm, the third group of solid state light emitters comprising at least a third solid state light emitter, each solid state light emitter in the third group of solid state light emitters emitting light having a dominant wavelength within a range of from about 610 nm to about 640 nm, the fourth light source emitting light that has a dominant wavelength that is outside each of the ranges of wavelength for the first, second and third groups of solid state light emitters, the lighting device configured to illuminate an item that comprises at least one color that is not more than 10 nm different from a dominant wavelength of light emitted from the fourth light source, each solid state light emitter in the second group of solid state light emitters having a dominant wavelength that differs from a dominant wavelength of each solid state light emitter in the third group of solid state light emitters by at least 70 nm.

20. A lighting device as recited in claim 19, wherein said fourth light source comprises at least one solid state light emitter.

21. A lighting device as recited in claim 19, wherein said fourth light source comprises a luminescent material.

22. A lighting device as recited in claim 19, wherein a combination of light emitted by the first group of solid state light emitters, the second group of solid state light emitters, the third group of solid state light emitters and the fourth light source is within ten MacAdam ellipses of at least one point on the blackbody locus.

23. A lighting device as recited in claim 19, wherein the first group of solid state light emitters, the second group of solid state light emitters, the third group of solid state light emitters and the fourth light source comprise all of the light emitters in the lighting device.

24. A lighting device as recited in claim 19, wherein:
the fourth light source comprises a fourth group of solid state light emitters, and
the lighting device further comprises a controller configured to adjust the intensity of light emitted by at least one solid state light emitter selected from among the first group of solid state light emitters, the second group of solid state light emitters, the third group of solid state light emitters and the fourth solid state light emitters, to maintain light emitted by the lighting device within ten MacAdam ellipses of at least one point on the blackbody locus.

25. An illuminated enclosure, comprising an enclosed space and at least one lighting device as recited in claim 19, wherein said lighting device illuminates at least a portion of said enclosed space.

26. An illuminated surface, comprising a surface and at least one lighting device as recited in claim 19, wherein if said lighting device is illuminated, said lighting device would illuminate at least a portion of said surface.

27. An illuminated area, comprising at least one item selected from among the group consisting of a swimming pool, a room, a warehouse, an indicator, a road, a vehicle, a road sign, a billboard, a ship, a toy, a mirror, a vessel, an electronic device, a boat, an aircraft, a stadium, a computer, a remote audio device, a remote video device, a cell phone, a tree, a window, a yard, a lamppost, an indicator light, or a device or array of devices that illuminate an enclosure, or a device that is used for edge or back-lighting, having mounted therein or thereon at least one lighting device as recited in claim 19.

* * * * *

UNITED STATES PATENT AND TRADEMARK OFFICE
CERTIFICATE OF CORRECTION

| | | |
|---|---|---|
| PATENT NO. | : 8,716,952 B2 | Page 1 of 1 |
| APPLICATION NO. | : 12/535319 | |
| DATED | : May 6, 2014 | |
| INVENTOR(S) | : Antony Paul Van de Ven | |

It is certified that error appears in the above-identified patent and that said Letters Patent is hereby corrected as shown below:

In the Claims

Column 22, line 29

(Claim 7) Please change: "a minor," to -- a mirror, --

Signed and Sealed this
Twenty-sixth Day of August, 2014

Michelle K. Lee
*Deputy Director of the United States Patent and Trademark Office*